(12) United States Patent
Joo et al.

(10) Patent No.: US 10,223,996 B2
(45) Date of Patent: Mar. 5, 2019

(54) DISPLAY APPARATUS AND POWER SUPPLY DEVICE

(71) Applicant: SAMSUNG ELECTRONICS CO., LTD., Suwon-si (KR)

(72) Inventors: Sung Yong Joo, Yongin-si (KR); Jin Hyung Lee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 232 days.

(21) Appl. No.: 15/185,279

(22) Filed: Jun. 17, 2016

(65) Prior Publication Data

US 2017/0039984 A1    Feb. 9, 2017

(30) Foreign Application Priority Data

Aug. 5, 2015    (KR) ........................ 10-2015-0110702

(51) Int. Cl.
| | |
|---|---|
| *G09G 5/00* | (2006.01) |
| *G06F 3/14* | (2006.01) |
| *G06F 3/147* | (2006.01) |
| *H05K 1/02* | (2006.01) |
| *H05K 3/28* | (2006.01) |
| *H02M 1/42* | (2007.01) |
| *H02M 3/335* | (2006.01) |
| *H02M 1/00* | (2006.01) |

(52) U.S. Cl.
CPC ............... *G09G 5/00* (2013.01); *G06F 3/147* (2013.01); *H05K 1/0256* (2013.01); *H05K 3/28* (2013.01); *G09G 2330/02* (2013.01); *G09G 2330/04* (2013.01); *H02M 1/4225* (2013.01); *H02M 3/33553* (2013.01); *H02M 2001/007* (2013.01); *H05K 2201/0162* (2013.01); *H05K 2201/0761* (2013.01); *H05K 2201/09909* (2013.01); *Y02B 70/126* (2013.01)

(58) Field of Classification Search
CPC .... G09G 5/00; G09G 2330/02; G09G 233/04; G06F 3/147
See application file for complete search history.

(56) References Cited

U.S. PATENT DOCUMENTS

| | | |
|---|---|---|
| 2008/0222827 A1 | 9/2008 | Veerasamy |
| 2010/0058834 A1 | 3/2010 | Cobianu et al. |

*Primary Examiner* — Jeremy C Norris
(74) *Attorney, Agent, or Firm* — Sughrue Mion, PLLC

(57) ABSTRACT

A power supply device of an electronic apparatus includes: a power input portion configured to receive alternating current (AC) power; a rectifier-smoother configured to rectify and smooth the received AC power and output the AC power; a power converter configured to convert a level of a voltage output from the rectifier-smoother to supply operating power to the electronic apparatus; a board on which the power input portion, the rectifier-smoother, and the power converter are provided; and a waterproof coating layer formed in an area on the board corresponding to a position of the power converter to prevent infiltration of moisture from an outside.

20 Claims, 16 Drawing Sheets

US 10,223,996 B2

DISPLAY APPARATUS AND POWER SUPPLY DEVICE

CROSS-REFERENCE TO RELATED APPLICATION

This application claims priority from Korean Patent Application No. 10-2015-0110702, filed on Aug. 5, 2015 in the Korean Intellectual Property Office, the disclosure of which is incorporated herein by reference in its entirety.

BACKGROUND

Field

Apparatuses and methods consistent with exemplary embodiments relate to a display apparatus and a power supply device, and more particularly, to a display apparatus and a power supply device which prevent infiltration of moisture from an outside into a printed circuit board (PCB).

Description of the Related Art

In a general power device, a withstanding voltage test is performed on a printed circuit board (PCB) to evaluate whether the PCB withstands a specified voltage limit, thereby checking insulating properties of components mounted on the PCB.

A withstanding voltage test on a PCB is performed by applying a voltage (for example, AC 3 KV, DC 4.24 KV) to the PCB which is left under, for example, tropical weather condition of 43° C. in temperature and 93% in humidity for about 120 hours, thereby checking insulating properties of components.

An FR-1 PCB has an insulating layer on an upper surface that is formed of paper and a phenolic resin and thus is vulnerable to moisture as compared with PCBs of other materials. Thus, when the FR-1 PCB is left under high humidity, moisture infiltrates into an upper or lower surface of the PCB to cause a decrease in spacing for insulation of components.

SUMMARY

An aspect of one or more exemplary embodiments provides a display apparatus and a power supply device in which a waterproof silk pattern is applied to a portion to which a withstanding voltage is applied on a printed circuit board (PCB) to prevent a change in insulating properties caused by humidity.

Another aspect of one or more exemplary embodiments provides a display apparatus and a power supply device in which a waterproof silk pattern is applied to an alternating current (AC) power input portion on a PCB to block humidity and to protect the PCB from overvoltage caused by lightning.

According to an aspect of an exemplary embodiment, there is provided a power supply device of an electronic apparatus including: a power input portion configured to receive alternating current (AC) power; a rectifier-smoother configured to rectify and smooth the received AC power and output the AC power; a power converter configured to convert a level of a voltage output from the rectifier-smoother to supply an operating power to the electronic apparatus; a board on which the power input portion, the rectifier-smoother, and the power converter are provided; and a waterproof coating layer formed in an area on the board corresponding to a position of the power converter.

Accordingly, a waterproof silk pattern is applied to a portion to which a withstanding voltage is applied on a printed circuit board (PCB) to prevent infiltration of moisture from an outside, thereby preventing a change in insulating properties of the PCB caused by humidity. Further, when an FR-1 PCB vulnerable to moisture is applied, a decline in insulating properties caused by humidity may be prevented at low cost.

The power converter may include: a transformer including a first coil configured to receive an input voltage from the rectifier-smoother and a second coil configured to convert the input voltage and provide an output voltage; and a switching element configured to switch so that a current selectively flows in the first coil of the transformer, wherein the area in which the waterproof coating layer is formed may include a first insulating area between the first coil and the second coil. Accordingly, a waterproof silk pattern is applied to a portion where the transformer to convert and output an input voltage is mounted on the PCB, thereby preventing a decrease in the insulating area between the two coils caused by humidity.

The power converter may further include: a light emitter of a photo coupler that is connected to the second coil of the transformer and may emit light according to a level of the operating power; and a light receiver of the photo coupler that may be connected to the first coil and may output a feedback signal according to light emission of the light emitter, wherein the area in which the waterproof coating layer is formed may include a second insulating area between the light emitter of the photo coupler and the light receiver of the photo coupler. Accordingly, a waterproof silk pattern is applied to a portion where the photo coupler to transmit an electrical signal via light is mounted on the PCB, thereby preventing a decrease in the insulating area between the light emitter and the light receiver of the photo coupler caused by humidity.

The power converter may further include a capacitor having both ends respectively connected to a first ground connected to the first coil of the transformer and a second ground connected to the second coil of the transformer, and the area in which the waterproof coating layer is formed may include a third insulating area in which the capacitor is provided. Accordingly, a waterproof silk pattern is applied to a portion where the capacitor connected to the grounds disposed to the two coils of the transformer is mounted on the PCB, thereby preventing a decrease in the insulating area between both ends of the capacitor caused by humidity.

The board may include a plurality of layers, the power converter may include at least one circuit element provided in one layer among the plurality of layers, and the area in which the waterproof coating layer is formed may include an area of the layer corresponding to a position of the at least one circuit element. Accordingly, a waterproof silk pattern is applied to at least one layer where a component is mounted on the multi-layer PCB among the layers, thereby preventing a change in insulating properties caused by humidity.

The waterproof coating layer may be formed on at least one of an upper surface and a lower surface of the layer in which the at least one circuit element is provided. Accordingly, a waterproof silk pattern is applied to the upper and lower surfaces of the PCB or upper and lower surfaces of at least one layer where a component is mounted on the PCB among the layers, thereby preventing a change in insulating properties caused by humidity.

The board may include a pair of lines including a first line and a second line to apply the AC power and a ground line connected to the second coil of the transformer, and the area in which the waterproof coating layer is formed may include a fourth insulating area corresponding to at least one among a region between the first line and the ground line and a region between the second line and the ground line. Accordingly, a waterproof silk pattern is applied to an area between the AC power input portion and the ground on the PCB, thereby blocking humidity and protecting the PCB from overvoltage caused by lightning.

The board may include a pair of lines including a first line and a second line to apply the AC power, a third line diverging from one of the first line and the second line, and a ground line connected to the second coil of the transformer, and the area in which the waterproof coating layer is formed may include a fifth insulating area between the third line and the ground line. Accordingly, a waterproof silk pattern is applied to an area between the line diverging from the AC power input portion and the ground on the PCB, thereby blocking humidity and protecting the PCB from overvoltage caused by lightning.

The ground line connected to the second coil of the transformer may be formed along a periphery of the board and extends to an input line of the power input portion. Accordingly, the AC power input portion is directly connected to the ground line on the PCB, thereby easily applying a waterproof silk pattern.

The board may include an FR-1 material. Accordingly, when the PCB includes the FR-1 material vulnerable to humidity, a waterproof silk pattern is applied to effectively prevent infiltration of moisture from an outside.

The waterproof coating layer may be formed by applying a waterproof silkscreen ink to the area on the board corresponding to the position of the power converter. Accordingly, the waterproof silkscreen ink is applied to the area where the component is mounted on the PCB, thereby preventing a change in insulating properties caused by humidity.

According to an aspect of another exemplary embodiment, there is provided a display apparatus including: a signal receiver configured to receive an image signal; a signal processor configured to process the received image signal; a display configured to display an image based on the processed image signal; and a power supply configured to receive alternating current (AC) power to supply an operating power to the display, wherein the power supply includes: a power input portion configured to receive the AC power; a rectifier-smoother configured to rectify and smooth the received AC power and output the AC power; a power converter configured to convert a level of a voltage output from the rectifier-smoother to supply operating power to the display apparatus; a board on which the power input portion, the rectifier-smoother, and the power converter are provided; and a waterproof coating layer formed in an area on the board corresponding to a position of the power converter.

Accordingly, a waterproof silk pattern is applied to a portion to which a withstanding voltage is applied on a PCB to prevent infiltration of moisture from an outside, thereby preventing a change in insulating properties of the PCB caused by humidity. Further, when an FR-1 PCB vulnerable to moisture is applied, a decline in insulating properties caused by humidity may be prevented at low cost.

The power converter may include: a transformer including a first coil configured to receive an input voltage from the rectifier-smoother and a second coil configured to convert the input voltage and provide an output voltage; and a switching element configured to switch so that a current selectively flows in the first coil of the transformer, wherein the area in which the waterproof coating layer is formed may include a first insulating area between the first coil and the second coil. Accordingly, a waterproof silk pattern is applied to a portion where the transformer to convert and output an input voltage is mounted on the PCB, thereby preventing a decrease in the insulating area between the two coils caused by humidity.

The power converter may further include: a light emitter of a photo coupler that may be connected to the second coil of the transformer and may emit light according to a level of the operating power; and a light receiver of the photo coupler that may be connected to the first coil and may output a feedback signal according to light emission of the light emitter, wherein the area in which the waterproof coating layer is formed may include a second insulating area between the light emitter of the photo coupler and the light receiver of the photo coupler. Accordingly, a waterproof silk pattern is applied to a portion where the photo coupler to transmit an electrical signal via light is mounted on the PCB, thereby preventing a decrease in the insulating area between the light emitter and the light receiver of the photo coupler caused by humidity.

The power converter may further include a capacitor having both ends respectively connected to a first ground connected to the first coil of the transformer and a second ground connected to the second coil of the transformer, and the area in which the waterproof coating layer is formed may include a third insulating area in which the capacitor is provided. Accordingly, a waterproof silk pattern is applied to a portion where the capacitor connected to the grounds disposed to the two coils of the transformer is mounted on the PCB, thereby preventing a decrease in the insulating area between both ends of the capacitor caused by humidity.

The board may include a plurality of layers, the power converter may include at least one circuit element provided in one layer among the plurality of layers, and the area in which the waterproof coating layer is formed may include an area of the layer corresponding to a position of the at least one circuit element. Accordingly, a waterproof silk pattern is applied to at least one layer where a component is mounted on the multi-layer PCB among the layers, thereby preventing a change in insulating properties caused by humidity.

The waterproof coating layer may be formed on at least one of an upper surface and a lower surface of the layer in which the at least one circuit element is provided. Accordingly, a waterproof silk pattern is applied to the upper and lower surfaces of the PCB or upper and lower surfaces of at least one layer where a component is mounted on the PCB among the layers, thereby preventing a change in insulating properties caused by humidity.

The board may include a pair of lines including a first line and a second line to apply the AC power and a ground line connected to the second coil of the transformer, and the area in which the waterproof coating layer is formed may include a fourth insulating area corresponding to at least one among a region between the first line and the ground line and a region between the second line and the ground line. Accordingly, a waterproof silk pattern is applied to an area between the AC power input portion and the ground on the PCB, thereby blocking humidity and protecting the PCB from overvoltage caused by lightning.

The board may include a pair of lines including a first line and a second line to apply the AC power, a third line diverging from one of the first line and the second line, and a ground line connected to the second coil of the transformer, and the area in which the waterproof coating layer is formed may include a fifth insulating area between the third line and the ground line. Accordingly, a waterproof silk pattern is applied to an area between the line diverging from the AC power input portion and the ground on the PCB, thereby blocking humidity and protecting the PCB from overvoltage caused by lightning.

The ground line connected to the second coil of the transformer may be formed along a periphery of the board and may extend to an input line of the power input portion. Accordingly, the AC power input portion is directly connected to the ground line on the PCB, thereby easily applying a waterproof silk pattern.

The board may include an FR-1 material. Accordingly, when the PCB includes the FR-1 material vulnerable to humidity, a waterproof silk pattern is applied to effectively prevent infiltration of moisture from an outside.

The waterproof coating layer may be formed by applying a waterproof silkscreen ink to the area on the board corresponding to the position of the power converter. Accordingly, the waterproof silkscreen ink is applied to the area where the component is mounted on the PCB, thereby preventing a change in insulating properties caused by humidity.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF EXEMPLARY EMBODIMENTS

Figure 1:
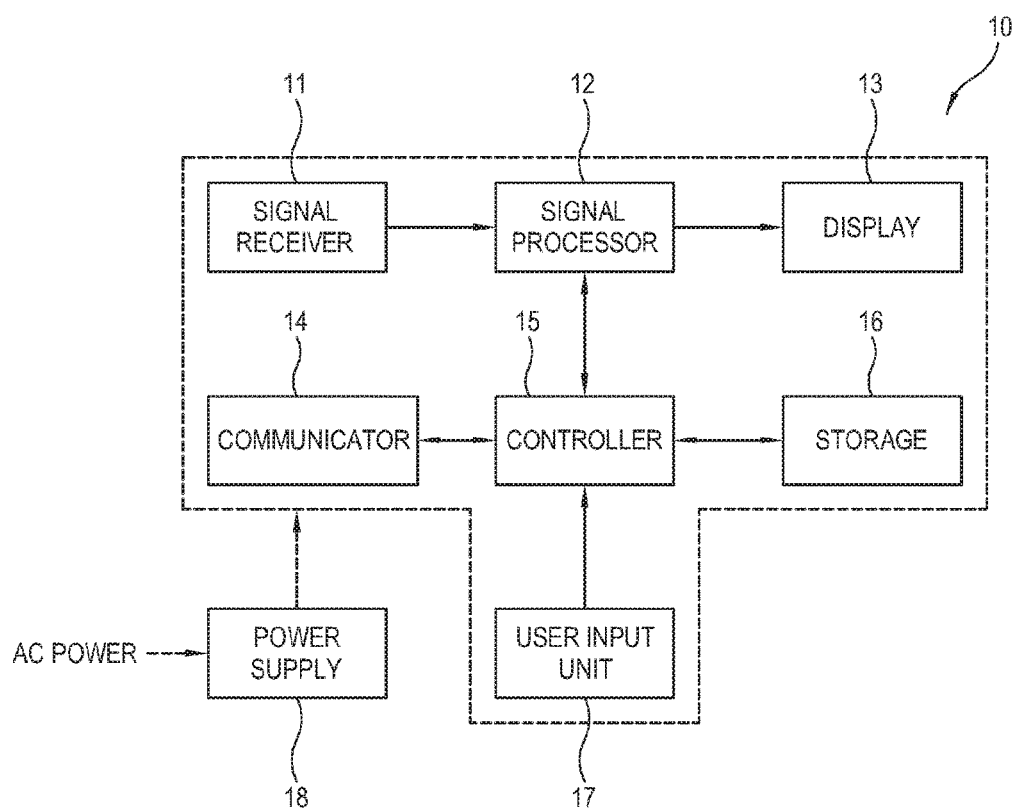
FIG. 1 is a block diagram illustrating a configuration of a display apparatus according to an exemplary embodiment.

Below, exemplary embodiments will be described in detail with reference to the accompanying drawings so that the exemplary embodiments may be readily implemented by those skilled in the art. However, it is to be noted that the present disclosure is not limited to the described exemplary embodiments but may be realized in various other ways. In the drawings, certain parts not directly relevant to the description may be omitted to enhance the clarity of the present disclosure, and like reference numerals denote like parts throughout the whole document.

FIG. 1 is a block diagram illustrating a configuration of a display apparatus according to an exemplary embodiment. As illustrated in FIG. 1, the display apparatus 10 according to an exemplary embodiment includes a signal receiver 11, a signal processor 12, a display 13, a communicator 14, a controller 15, a storage 16 (e.g., a memory), a user input unit 17 (e.g., user input interface), and a power supply 18, and may be configured as, for example, a TV, a smartphone, a tablet computer, a personal computer (PC), a netbook, a notebook, and the like. Components included in the display apparatus 10 are not limited to the aforementioned examples, and other additional components may be included in the display apparatus 10.

The signal receiver 11 receives an image signal from an outside. The signal receiver 11 may be provided in various forms according to standards of received broadcast signals and configurations of the display apparatus 10. For example, the signal receiver 11 may be configured as a tuner that receives a radio frequency (RF) broadcast signal transmitted from a broadcasting station or a satellite signal. Alternatively, the signal receiver 11 may receive an image signal from an imaging device, for example, a DVD, a BD device, or the like, connected to the display apparatus 10. Alternatively, in addition to the image signal, the signal receiver 11 may receive an audio signal for outputting a sound and a data signal for outputting data information, in which case the image signal, the audio signal, and the data signal may be received together through a single signal. The signal receiver 11 may receive a broadcast signal with various configurations, without being limited to an exemplary embodiment.

The signal processor 12 performs a plurality of kinds of signal processing on an image signal received by the signal receiver 11. The plurality of kinds of processing may include elimination of interference from the image signal, forward error correction (FEC), an ATV/DTV AGC speed change, an equalizer slope change, a pilot size change, a symbol rate detection range change, a phase tracking loop gain, a frequency change, or the like, without being limited to an exemplary embodiment. Further, the signal processor 12 may process an audio signal and a data signal received by the signal receiver 11.

The display 13 displays an image based on an image signal processed by the signal processor 12. The display 13 may be configured, without being limited, as various forms, such as a plasma display panel (PDP), a liquid crystal display (LCD), organic light emitting diodes (OLED), a flexible display, or the like.

The communicator 14 may communicate with an external device through a network, such as the Internet. Further, the communicator 14 may communicate with an external device using a communication method including Bluetooth, Wi-Fi, or the like. The communicator 14 performs communication according to control by the controller 15 and may transmit information to an external device or receive information from an external device. The information received from the external device through the communicator 14 may include image information, audio information, and data information, which may be output through the display 13 or the like via processing.

The user input unit 17 receives a user input. The user input unit 17 may be configured as, for example, a keyboard, a mouse, or the like, and also be configured as an input panel provided on an outside of the display apparatus 10. According to an exemplary embodiment, the user input unit 17 may receive a user input through a remote control. Further, the user input may include at least one of a menu selection, a shortcut key input, a voice command, and motion recognition. The user input received by the user input unit 17 is transmitted to the controller 15 so that a corresponding operation is performed.

The storage 16 is a component to store data and information in the display apparatus 10 and may be configured as, for example, a nonvolatile memory including a hard disk and a flash memory.

The controller 15 controls other components of the display apparatus 10 overall. The controller 15 may include firmware as a control program, and a central processing unit (CPU) and a random-access memory (RAM) to run the firmware.

The power supply 18 receives alternating current (AC) power input and supplies operating power to a component of the display apparatus 10, such as the display 13. The power supply 18 converts the input AC power into a level of power needed for a component, such as the display 13, and supplies the power to the component.

In the display apparatus 10 according to an exemplary embodiment, a waterproof coating layer is formed in an area on a board corresponding to part of components of the power supply 18 to block moisture infiltrating from an outside, thereby preventing a change in insulating properties caused by humidity.

Hereinafter, a configuration of the power supply 18 will be described in detail with reference to FIGS. 2 to 4.

Figure 2:
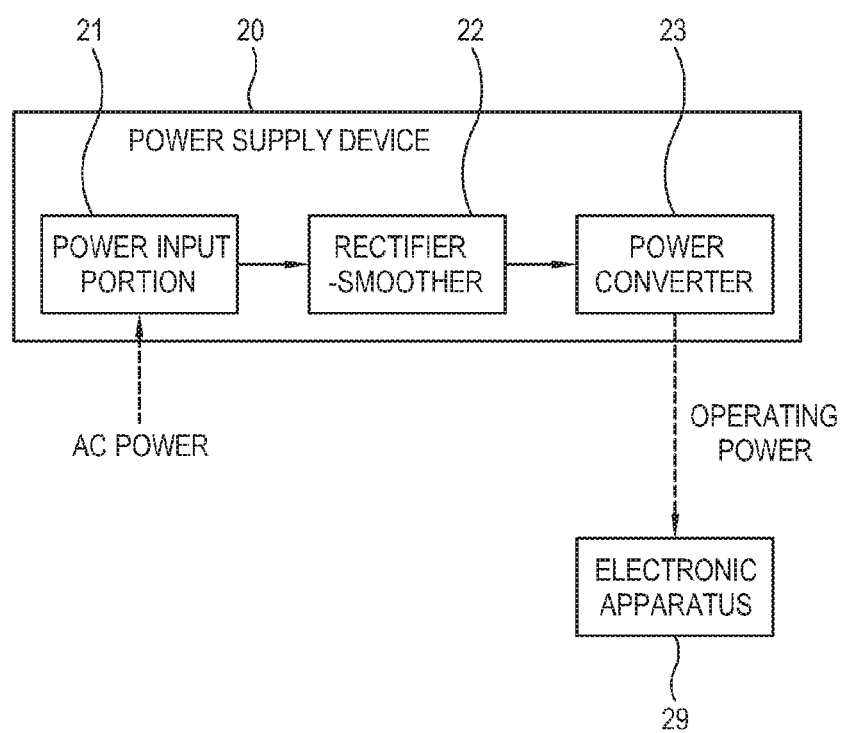
FIG. 2 is a block diagram illustrating a configuration of a power supply device according to an exemplary embodiment.

FIG. 2 is a block diagram illustrating a configuration of a power supply device according to an exemplary embodiment. As illustrated in FIG. 2, the power supply device 20 includes a power input portion 21, a rectifier-smoother 22, a power converter 23, and a board on which the aforementioned components are provided. Further, the power supply device 20 includes a waterproof coating layer formed in an area on the board corresponding to a position of the power converter 23 to prevent infiltration of moisture from an outside. Further, the power supply device 20 may further include an AC filter and a discharge circuit. The AC filter may include the power input portion 21. The power supply device 20 supplies operating power to an electronic apparatus 29. The electronic apparatus 29 may be provided as, for example, a display apparatus, and the power supply device 20 may be included in the electronic apparatus 29.

The power input portion 21 receives AC power. The AC filter filters the input AC power to remove noise.

The rectifier-smoother 22 rectifies and smoothes AC power, input to the power input portion 21 and filtered by the AC filter, to output the AC power. The rectifier-smoother 22 rectifies a current output through the AC filter to convert an AC into a direct current (DC). The rectifier-smoother 22 may include a bridge diode and rectify a current using the bridge diode.

The rectifier-smoother 22 may include a smoothing capacity to smooth a DC voltage, output by rectifying a current output through the AC filter. The rectifier-smoother boosts a voltage charged in the smoothing capacitor to improve a power factor of the power supply device 20.

The power converter 23 converts a level of a voltage output from the rectifier-smoother 22 to supply operating power to the electronic apparatus 29. For example, the power converter 23 may supply operating power to one of components included in the electronic apparatus 29. Alternatively, the power converter 23 may supply operating power corresponding to each of a plurality of components included in the electronic apparatus 29.

On the board may be provided the power input portion 21, the rectifier-smoother 22, and the power converter 23. The board may be, for example, an FR-1 printed circuit board (PCB). The FR-1 PCB has an insulating layer on an upper surface that is formed of paper and a phenolic resin and thus is vulnerable to moisture. The board may be, for example, a single-sided PCB, a double-sided PCB, a multi-layer PCB, an Interstitial Via Hole (IVH) multi-layer board (MLB), or the like. The board is not limited to these examples but may include various kinds of PCBs.

The waterproof coating layer may be formed on at least one of an upper surface and a lower surface of the board. When the board includes a plurality of layers, the waterproof coating layer may be formed on at least one of an upper surface and a lower surface of a layer on which the power converter 23 is provided among the layers. According to an exemplary embodiment, the waterproof coating layer may be formed by applying a waterproof silkscreen ink to the area on the board corresponding to the position of the power converter 23.

According to an exemplary embodiment, the waterproof coating layer may be formed using a silicone material, for example, silicone dielectric gel among various types of silicone. Silicone dielectric gel is a sticky substance which may be cured at room temperature or acceleratedly cured by heat to form an elastic material serving as a buffer and having a self-restoring function. Further, silicone dielectric gel may provide a high stress relaxation function for the board and protects the board from humid and noxious environments.

Figure 3:
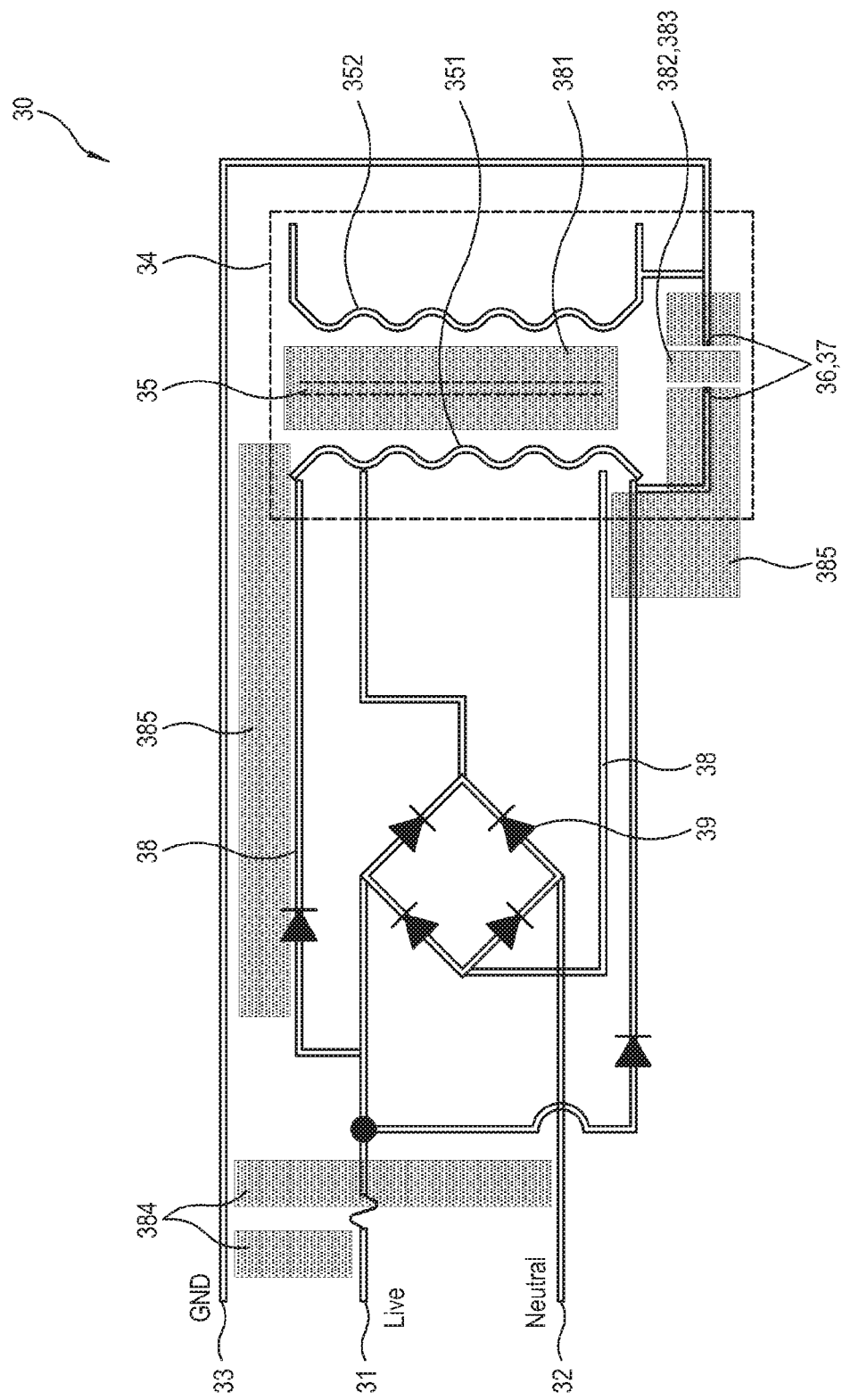
FIG. 3 illustrates a configuration of a circuit of a power supply device according to an exemplary embodiment.

FIG. 3 illustrates a configuration of a circuit of a power supply device according to an exemplary embodiment. As illustrated in FIG. 3, the power supply device 30 includes a pair of a first line 31 and a second line 32 to which AC power is applied, a bridge diode 39 to rectify input AC power, and a power converter 34 to convert a level of a voltage rectified and output from the bridge diode 39, which correspond to the power input portion 21, part of the rectifier-smoother 22, and the power converter 23 in FIG. 2, respectively, and thus detailed descriptions thereof are omitted. The power supply device 30 includes a board on which the foregoing components are provided, and the board may be, for example, an FR-1 PCB.

Figure 11:
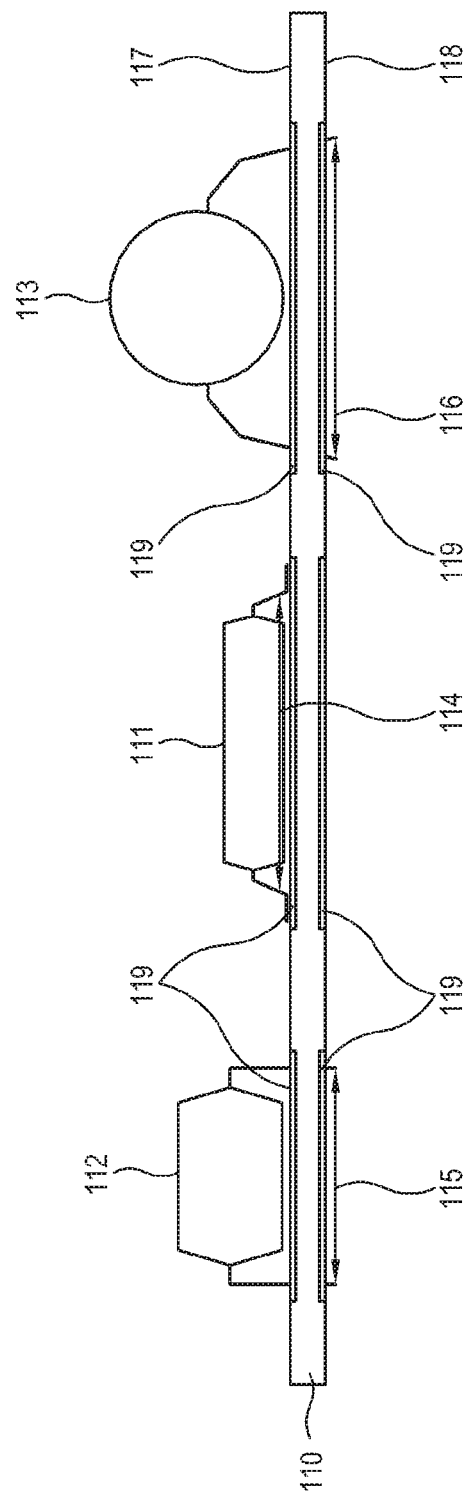
FIG. 11 is a lateral view illustrating a case where a waterproof silk pattern is applied to a portion on which a component is mounted on a PCB according to an exemplary embodiment.

According to an exemplary embodiment, the power converter 34 includes a transformer including a first coil 351 to receive an input voltage from the bridge diode 39 and a second coil 352 to convert the input voltage and to output an output voltage, and a switching element to switch so that a current selectively flows in the first coil 351 of the transformer 35. Here, a waterproof coating layer formed in an area on the board may be formed to include a first insulating area 381 between the first coil 351 and the second coil 352. For example, as illustrated in FIG. 11, a waterproof silk pattern is applied to areas of an upper surface 117 and a lower surface 118 corresponding to a first insulating area 114 for a transformer 111 mounted on a PCB 110 so that moisture does not infiltrate into a gap between the transformer 111 and the PCB 110, thereby preventing a decrease in the first insulating area 114.

According to an exemplary embodiment, the power converter 34 may further include a light emitter of a photo coupler 36 that is disposed to the second coil 352 of the transformer 35 and emits light according to a level of operating power and a light receiver of the photo coupler 36 that is disposed to the first coil 351 and outputs a feedback signal according to light emission of the light emitter. Here, the waterproof coating layer formed in the area on the board may be formed to include a second insulating area between the light emitter of the photo coupler 36 and the light receiver of the photo coupler 36. For example, as illustrated in FIG. 11, a waterproof silk pattern is applied to areas of the upper surface 117 and the lower surface 118 corresponding to a second insulating area 115 for a photo coupler 112 mounted on the PCB 110 so that moisture does not infiltrate into a gap between the photo coupler 112 and the PCB 110, thereby preventing a decrease in the second insulating area 115.

According to an exemplary embodiment, the power converter 34 may further include a capacitor 37 having both ends connected to a first ground disposed to the first coil 351 of the transformer 35 and a second ground disposed to the second coil 352 of the transformer 35, respectively. Here, the capacitor 37 may be, for example, a Y capacitor. The Y capacitor is connected in parallel between the first ground and the second ground to bypass high-frequency noise introduced or discharged through the first ground and the second ground, thereby suppressing noise. Here, the waterproof coating layer formed in the area on the board may be formed to include a third insulating area in which the capacitor 37 is provided. For example, as illustrated in FIG. 11, a waterproof silk pattern is applied to areas of the upper surface 117 and the lower surface 118 corresponding to a third insulating area 116 for a Y capacitor 113 mounted on the PCB 110 so that moisture does not infiltrate into a gap between the Y capacitor 113 and the PCB 110, thereby preventing a decrease in the third insulating area 116.

According to an exemplary embodiment, the board may include the pair of the first line 31 and the second line 32 to which the AC power is applied and a ground line 33 disposed to the second coil 352 of the transformer 35. For example, the first line 31 may be a live line, and the second line 32 may be a neutral line. The ground line 33 may be formed along a periphery of the board from the second coil 352 of the transformer 35 to extend to an input line of a power input portion.

Figure 12:
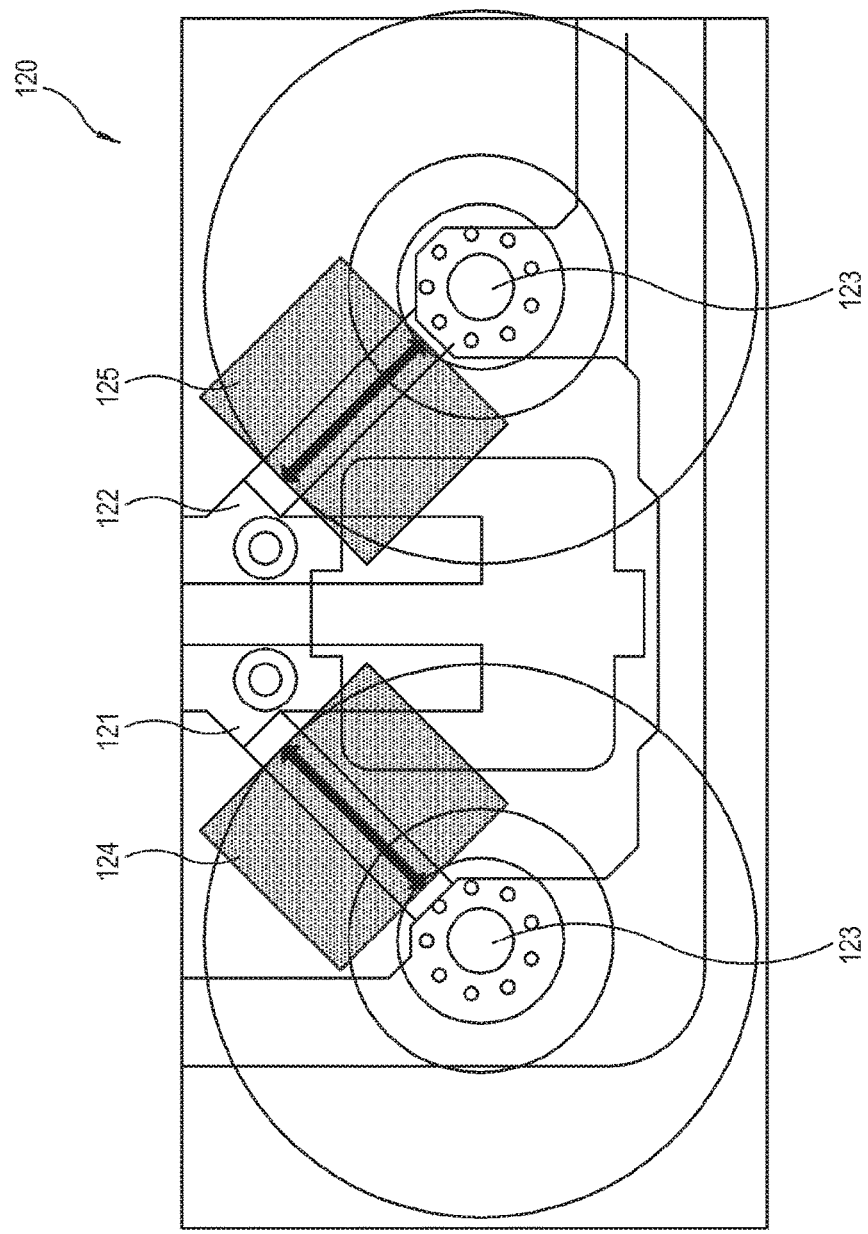
FIG. 12 is a lateral view illustrating a case where a waterproof silk pattern is applied to an AC power input portion on a PCB according to an exemplary embodiment.

Here, the waterproof coating layer formed in the area on the board may be formed to include a fourth insulating area 384 corresponding to at least one of a region between the first line 31 and the ground line 33 and a region between the second line 32 and the ground line 33. For example, as illustrated in FIG. 12, a waterproof silk pattern may be applied to areas of upper and the lower surfaces of a PCB 120 corresponding to an insulating area 124 between a live line 121 and a ground line 123 of a power input portion in the PCB 120. Further, a waterproof silk pattern may be applied to areas of upper and the lower surfaces of the PCB 120 corresponding to an insulating area 125 between a neutral line 122 and the ground line 123 of the power input portion. Accordingly, infiltration of moisture into the power input portion may be prevented so as not to decrease the insulating areas 124 and 125 and the PCB 120 may be protected from overvoltage caused by lightning.

According to an exemplary embodiment, the board may include the pair of the first line 31 and the second line 32 to which the AC power is applied, a third line 38 diverging from any one of the first line 31 and the second line 32, and the ground line 33 disposed to the second coil 352 of the transformer 35. Here, the waterproof coating layer formed in the area on the board may be formed to include a fifth insulating area 385 between the third line 38 and the ground line 33. For example, a waterproof silk pattern may be applied so that an insulating area between a line diverging from a live line or neutral line to which power is input and a ground is not decreased by moisture infiltrated from an outside.

In the power supply device 30 according to an exemplary embodiment, a waterproof coating layer is formed in an area on the board corresponding to a withstanding voltage application portion and a power input portion, thereby preventing a change in insulating properties caused by humidity.

Figure 4:
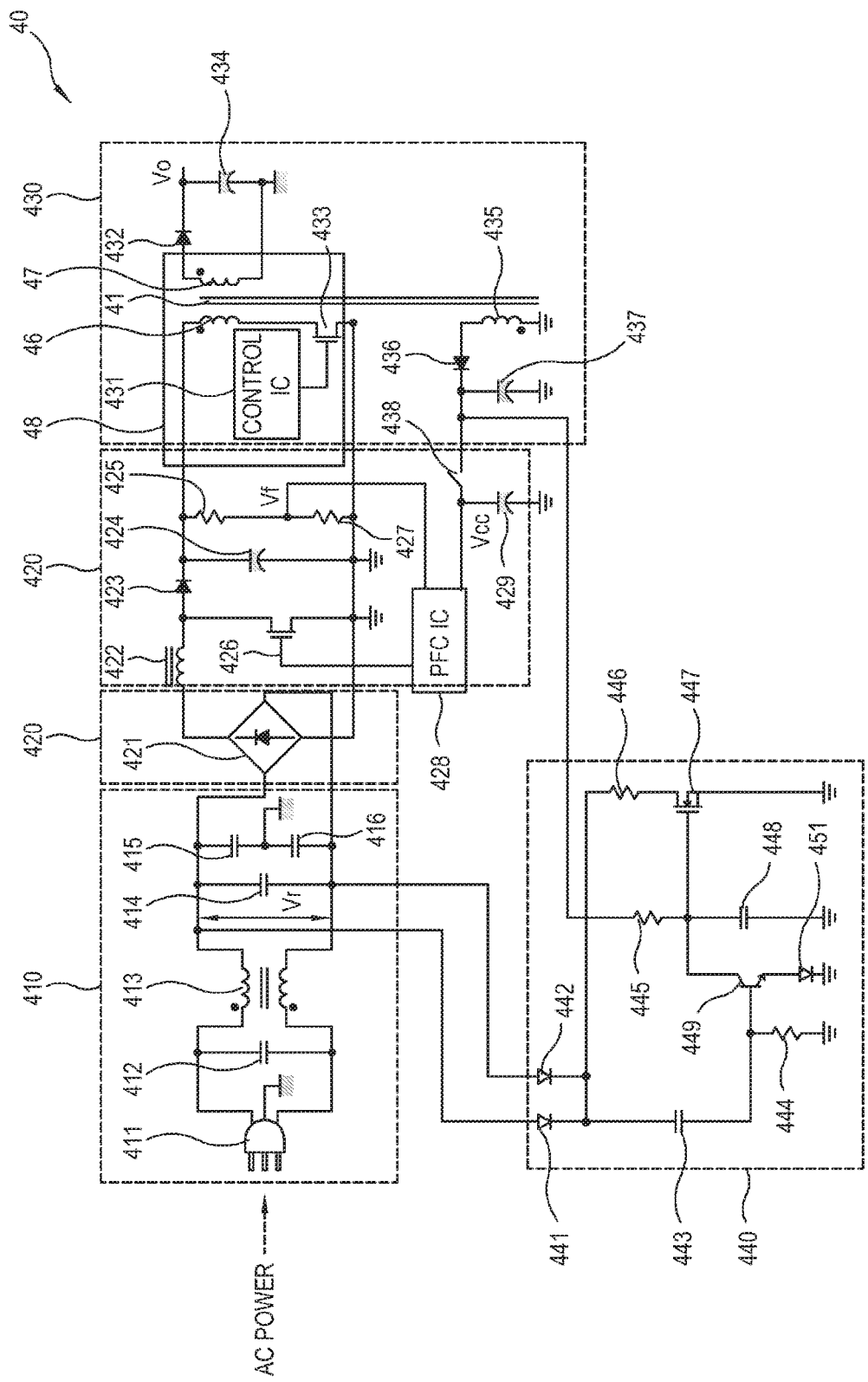
FIG. 4 illustrates a configuration of a circuit of a power supply device according to an exemplary embodiment.

FIG. 4 illustrates a configuration of a circuit of a power supply device according to an exemplary embodiment. As illustrated in FIG. 4, the power supply device 40 includes an AC filter 410, a rectifier-smoother 420, a power converter 430, and a discharge circuit 440. The rectifier-smoother 420 and the power converter 430 correspond to the rectifier-smoother 22 and the power converter 23 of FIG. 2, respectively, and the AC filter 410 includes the power input portion 21 of FIG. 2.

The AC filter 410 filters input AC power to remove noise. The AC filter 410 may include a first capacitor 412 connected to both ends of a power cord 411, a first transformer 413, a second capacitor 414, a third capacitor 415, and a fourth capacitor 416. The AC filter 410 charges a predetermined level of voltage Vr in the second capacitor 414 in a normal operation.

The rectifier-smoother 420 includes a bridge diode 421 that rectifies a current output from the AC filter 410 to convert an AC into a DC. The rectifier-smoother 420 includes a smoothing capacitor to smooth a DC voltage output from the bridge diode 421. Further, the rectifier-smoother 420 may further include an inductor 422, a first diode 423, a pair of feedback resistors 425 and 427, a first switch 426, and a power factor correction (PFC) integrated circuit (IC) 428. The PFC IC 428 may switch the first switch 426 with a predetermined frequency based on a voltage Vf fed back by the feedback resistors 425 and 427 to boost a voltage charged in the smoothing capacitor 424, thereby improving a power factor of the power supply device 40.

The power converter 430 converts a level of a voltage output from the rectifier-smoother 320 to supply operating power Vo to the display 13 or the like. The power converter 430 includes a second transformer 41 connected to an output terminal of the PFC IC 428, a second switch 433 connected in series to a first coil 46 of the second transformer 41 to control flow of a current, a control IC 431 to switch the second switch 433, a second diode 432 disposed to a second coil 47 to rectify output operating power Vo, and a fifth capacitor 434 to maintain a level of operating power Vo.

The power converter 430 may include a waterproof coating layer provided on a board where an electric circuit is configured and formed in an area on the board corresponding to a position of the power converter 430 to prevent infiltration of moisture from an outside. According to an exemplary embodiment, in the power converter 430, a waterproof silkscreen ink may be applied on upper and lower surfaces of the board corresponding to an area needing insulation between the first coil 46 and the second coil 47 of the second transformer 41, thereby preventing infiltration of moisture from an outside. Alternatively, in the power converter 430, silicone dielectric gel having a waterproof function may be applied on the upper and lower surfaces of the board corresponding to an area needing insulation between the first coil 46 and the second coil 47 of the second transformer 41, thereby preventing infiltration of moisture from an outside.

The control IC 431 switches the second switch 433 so that a level of operating power Vo reaches a target value. Operating power Vo is power needed for operations of the display 13 or the like and has a level corresponding to a component to which the operating power Vo is supplied. For example, operating power Vo supplied to the controller 15, such as a CPU or microcomputer, may be about 5 V. According to an exemplary embodiment, when operating power Vo is supplied to each of a plurality of components, the power converter 430 may further include equivalent or similar components to the second coil 47 of the second transformer 41, the second diode 432, and the fifth capacitor 434 corresponding to individual operating power Vo. In this case, a plurality of levels of operating power Vo may correspond to target components to which a plurality of levels of operating power Vo is supplied and be different from each other.

According to an exemplary embodiment, the rectifier-smoother 420 may further include a third coil 435, a third diode 436, a sixth capacitor 437, a seventh capacitor 429, and a power switch 438, which do not operate in a standby mode but operate in a normal mode. These components are not limited by an exemplary embodiment but may be realized in different forms or be selectively realized. A voltage is generated in the third coil 435 by the second coil 47 of the second transformer 41. The voltage generated in the third coil 435 is charged in the sixth capacitor 437. The power switch 438 controls connection between the seventh capacitor 429 and the third diode 436 and the sixth capacitor 437. When the power switch 438 is closed, the voltage charged in the sixth capacitor 437 is transmitted to the seventh capacitor 429 or the voltage generated in the third coil 435 is charged in the seventh capacitor 429. The seventh capacitor 429 is connected to the PFC IC 428 to supply the charged voltage as a PFC driving voltage Vcc to the PFC IC 428.

In the standby mode, the power switch 438 is open, in which case a PFC driving voltage Vcc is not supplied to the PFC IC 428, and thus the rectifier-smoother 420 does not normally function to smooth a current. However, when a user turns on the power through the user input unit 17, a corresponding power-on signal is transmitted to the power switch 438 so that the power switch 438 is closed. In this case, a PFC driving voltage Vcc is supplied to the PFC IC 428, and accordingly the rectifier-smoother 420 may normally perform an operation of smoothing a current.

The discharge circuit 440 includes a discharge element 446, a first discharge diode 441, a second discharge diode 442, and a first switching portion 447. The discharge element 446 discharges a voltage remaining in the power supply device 40 when input of AC power is suspended. The discharge element 446 may be configured as a resistor. One end of the discharge element 446 is connected to both ends of the second capacitor 414 of the AC filter 410 via the first discharge diode 441 and the second discharge diode 442. Another end of the discharge element 446 is grounded via the first switching portion 447.

The first discharge diode 441 and the second discharge diode 442 have anodes and cathodes directions of which are determined such that a current flows from the second capacitor 414 to the discharge element 446. Thus, when the first switching portion 447 is turned on, a remaining voltage Vr charged in the second capacitor 414 may be discharged as a current flows to the discharge element 446 through the first discharge diode 441 or second discharge diode 442.

The discharge circuit 440 is not limited to the configuration illustrated in an exemplary embodiment but may be configured with some components being omitted or additional components being included.

Figure 5:
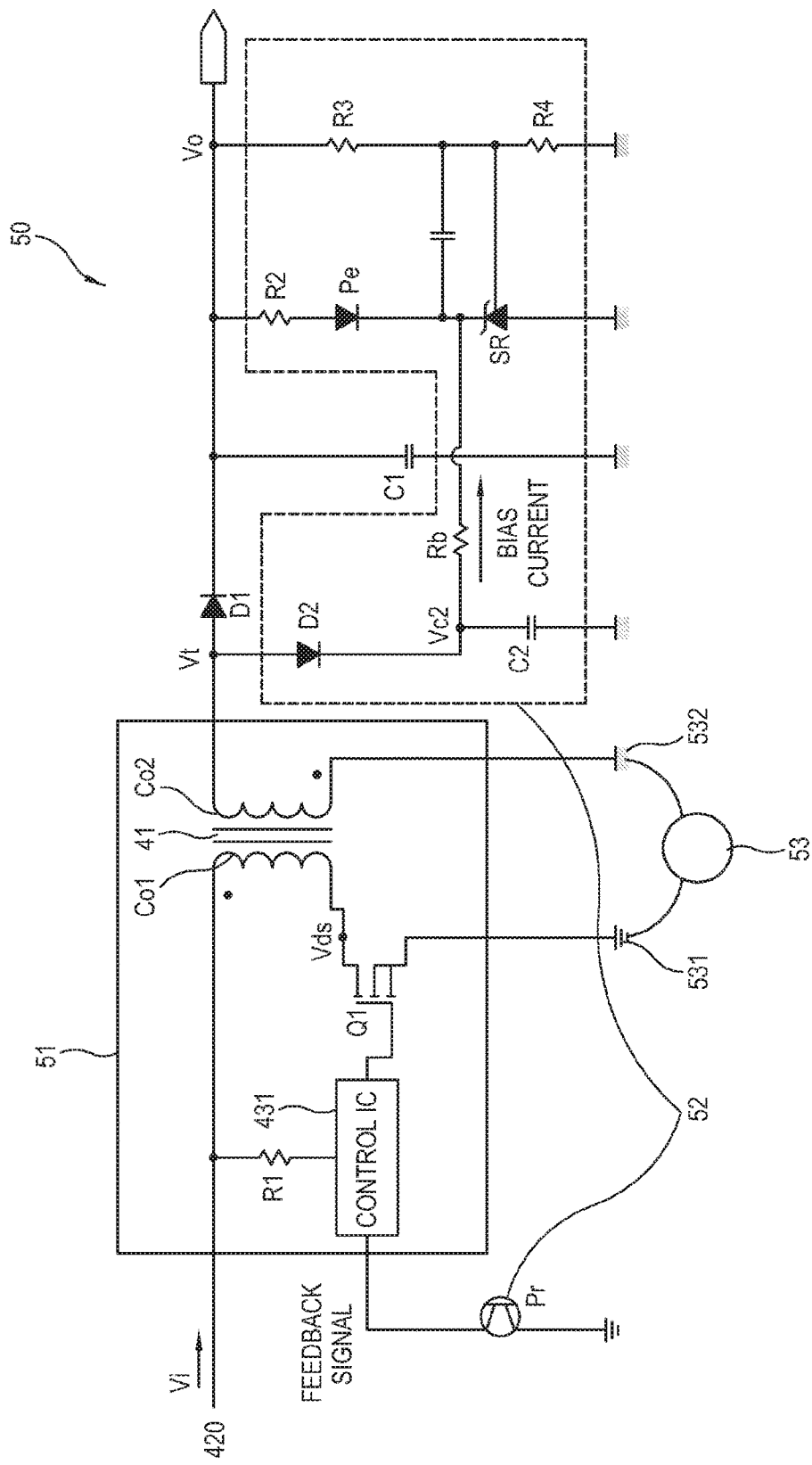
FIG. 5 illustrates a configuration of a circuit of a power converter in a power supply device according to an exemplary embodiment.

FIG. 5 illustrates a configuration of a circuit of a power converter in a power supply device according to an exemplary embodiment. As illustrated in FIG. 5, the power converter 50 includes the components of the power converter 430 of FIG. 4 and further includes additional components. A portion 51 of the power converter 50 includes the same components as a portion 48 of the power converter 430 of FIG. 4. That is, a transformer 41, a first coil Co1, a second coil Co2, a switching element Q1, and a control IC 431 of the power converter 50 correspond to the second transformer 41, the first coil 46, the second coil 47, the second switch 433, and the control IC 431, respectively.

The power converter 50 may include a switching portion 41 and Q1, a first rectifier-smoother D1 and C1, the control IC 431, a feedback portion 52, and a capacitor 53.

The switching portion 41 and Q1 receives an input voltage Vi from the rectifier-smoother 420 of FIG. 4 and converts the input voltage Vi to output an output voltage Vt. The switching portion 41 and Q1 includes the transformer 41 including the first coil Co1 to receive an input voltage vi from the rectifier-smoother of FIG. 4 and the second coil Co2 to convert the input voltage Vi to output an output voltage Vt, and the switching element Q1 to switch such that a current selectively flows in the first coil Co1 of the transformer 41. Here, the switching element Q1 may be configured as a field-effect transistor (FET). When the switching element Q1 is turned on, a current flows in the first coil Co1. When the switching element Q1 is turned off, no current flows in the first coil Co1. When there is a change in current flowing in the first coil Co1, a corresponding size of an output voltage Vt is applied to the second coil Co2.

The switching portion 41 and Q1 may be provided on a board where an electric circuit is configured, and a waterproof coating layer may be formed in an area on the board corresponding to a position of the switching portion 41 and Q1 to prevent infiltration of moisture from an outside. According to an exemplary embodiment, a waterproof silkscreen ink may be applied on upper and lower surfaces of the board corresponding to an area needing insulation between the first coil Co1 and the second coil Co2 of the transformer 41, thereby preventing infiltration of moisture from an outside. Alternatively, silicone dielectric gel having a waterproof function may be applied on the upper and lower surfaces of the board corresponding to an area needing insulation between the first coil Co1 and the second coil Co2 of the transformer 41, thereby preventing infiltration of moisture from an outside.

The first rectifier-smoother D1 and C1 includes a fourth diode D1 to rectify an output voltage Vt applied to the second coil Co2 of the switching portion 41 and Q1 and an eighth capacitor C1 to smooth the voltage rectified by the fourth diode D1 to provide an operating voltage Vo.

The control IC 431 controls the switching portion 41 and Q1 so that an operating voltage Vo reaches a target value. The target value of the operating voltage Vo may be set variously considering characteristics of the display apparatus 10 and may be, for example, about 5 V, without being limited thereto. The control IC 431 has pulse-width modulation (PWM) control as a technique for controlling the switching portion 41 and Q1. The power converter 50 may further include a first resistor R1 between the control IC 431 and an input voltage Vi so that the control IC 431 detects the input voltage Vi.

The feedback portion 53 may include a light emitter Pe of a photo coupler connected to an operating voltage Vo through a second resistor R2 and a light receiver Pr of the photo coupler that switches according to light emission of the light emitter Pe to provide a feedback signal of the operating voltage Vo to the control IC 431. The light emitter Pe emits light when a current flowing through the light emitter Pe is a predetermined value or higher. Further, the feedback portion 53 may further include a shunt regulator (SR) that detects a level of an operating voltage Vo through a third resistor R3 and a fourth resistor R4, and short-circuits when the operating voltage Vo reaches a threshold. One end of the shunt regulator SR is connected to the light emitter Pe and another end thereof is grounded. When the shunt regulator SR is open, no current substantially flows in the light emitter Pe. On the contrary, when the shunt regulator SR short-circuits, a current flows in the light emitter Pe through the shunt regulator SR.

The feedback portion 52 may be provided on the board where the electric circuit is configured, and a waterproof coating layer may be formed in an area on the board corresponding to a position of the feedback portion 52 to prevent infiltration of moisture from an outside. According to an exemplary embodiment, a waterproof silkscreen ink may be applied on upper and lower surfaces of the board corresponding to an area needing insulation between the light emitter Pe and the light receiver Pr of the photo coupler, thereby preventing infiltration of moisture from an outside. Alternatively, silicone dielectric gel having a waterproof function may be applied on the upper and lower surfaces of the board corresponding to an area needing insulation between the light emitter Pe and the light receiver Pr of the photo coupler, thereby preventing infiltration of moisture from an outside.

The power converter 50 may further include a capacitor 53 having both ends respectively connected to a first ground 531 disposed to the first coil Co1 of the transformer 41 and a second ground 532 disposed to the second coil Co2 of the transformer 41. The capacitor 53 may be, for example, a Y capacitor. The Y capacitor is connected in parallel between the first ground and the second ground to bypass high-frequency noise introduced or discharged through the first ground and the second ground, thereby suppressing noise. The capacitor 53 may be provided on the board where the electric circuit is configured, and a waterproof coating layer may be formed in an area on the board corresponding to a position of the capacitor 53 to prevent infiltration of moisture from an outside. According to an exemplary embodiment, a waterproof silkscreen ink or silicone dielectric gel having a waterproof function may be applied on upper and lower surfaces of the board corresponding to an area where the capacitor 53 is disposed, thereby preventing infiltration of moisture from an outside. Accordingly, a decline in insulating properties in the area where the capacitor 53 is disposed may be prevented.

As described above, in the power converter 50 according to an exemplary embodiment, the waterproof coating layers are formed in the areas on the board corresponding to the insulating area between the first coil Co1 and the second coil Co2 of the transformer 41, the insulating area between the light emitter Pe and the light receiver Pr of the photo coupler, and the insulating area where the capacitor 53 is disposed, thereby preventing a decline in insulating properties of these components.

Figure 6:
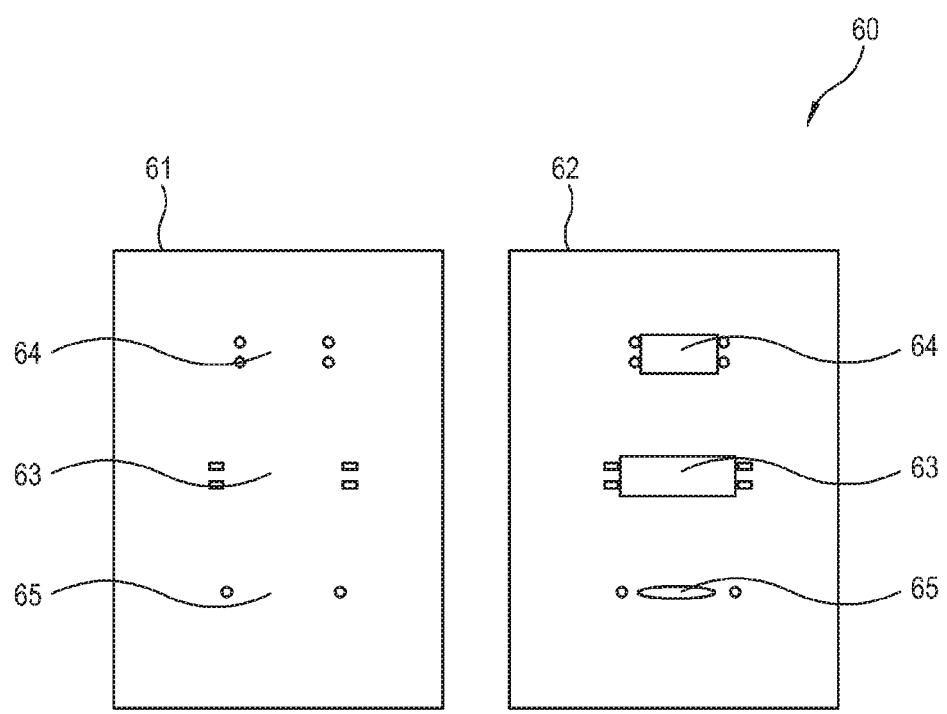
FIG. 6 illustrates an insulating area of a portion to which a withstanding voltage is applied on a PCB according to an exemplary embodiment.

FIG. 6 illustrates an insulating area of a portion to which a withstanding voltage is applied on a PCB according to an exemplary embodiment. FIG. 6 shows that the transformer 35, the photo coupler 36, and the Y capacitor 37 among the components of the power supply device 30 of FIG. 3 are mounted on the PCB 60. The respective components are mounted on the PCB 60 through through-holes. The PCB 60 may include an FR-1 material, and an FR-1 PCB 60 has an upper surface that is formed of paper and a phenolic resin and thus is vulnerable to moisture.

The PCB 60 includes a first insulating area 63 formed between the first coil 351 and the second coil 352 of the transformer 35, a second insulating area 64 formed between the light emitter and the light receiver of the photo coupler 36, and a third insulating area 65 where the Y capacitor 37 is disposed. The first insulating area 63, the second insulating area 64, and the third insulating area 65 are areas corresponding to positions of the respective components mounted on the PCB 60 and need to maintain insulating properties so that the power supply device 30 normally operates. However, when moisture infiltrates into a gap between the mounted components and an upper surface 61 or lower surface 62 of the PCB 60, the first insulating area 63, the second insulating area 64, and the third insulating area 65 may be reduced, and accordingly the transformer 35, the photo coupler 36, and the Y capacitor 37 corresponding to the respective insulating areas are unable to function properly.

Figure 7:
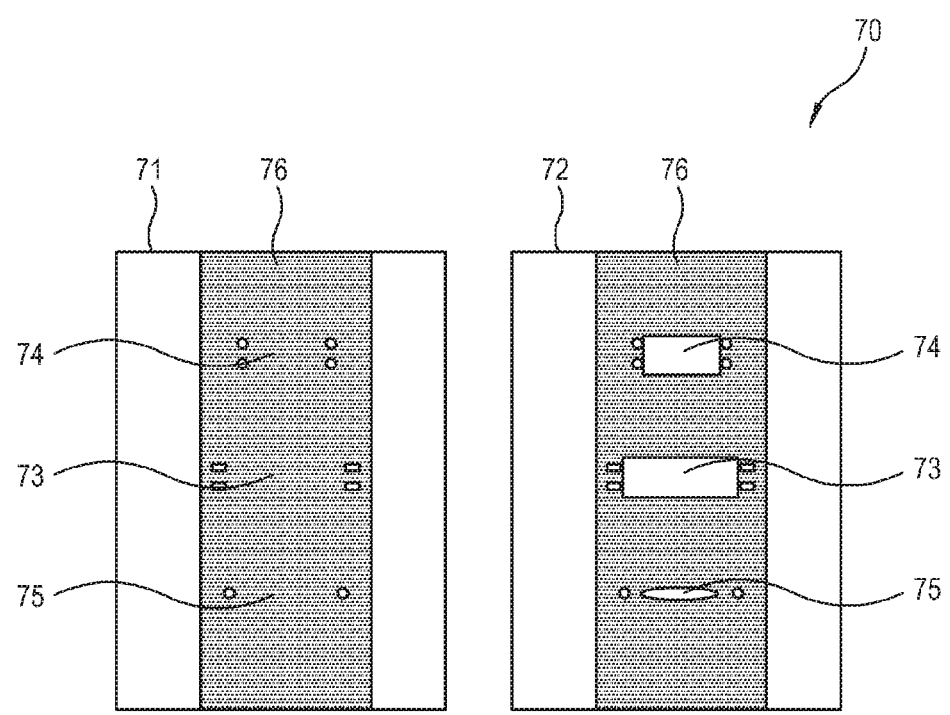
FIG. 7 illustrates an example of applying a waterproof silk pattern to a portion to which a withstanding voltage is applied on a PCB according to an exemplary embodiment.

FIG. 7 illustrates an example of applying a waterproof silk pattern to a portion to which a withstanding voltage is applied on a PCB according to an exemplary embodiment. As illustrated in FIG. 7, the PCB 70 includes a first insulating area 73 formed between the first coil 351 and the second coil 352 of the transformer 35, a second insulating area 74 formed between the light emitter and the light receiver of the photo coupler 36, and a third insulating area 75 where the Y capacitor 37 is disposed. A waterproof coating layer 76 may be formed in an area on at least one of an upper surface 71 and a lower surface 72 including the first insulating area 73, the second insulating area 74, and the third insulating area 75 corresponding to the respective components mounted on the PCB 70. For example, the waterproof coating layer 76 may be formed by applying a waterproof silkscreen ink or silicone dielectric gel having a waterproof function to the PCB 70.

Accordingly, a decline in insulating properties of the transformer 35, the photo coupler 36, and the Y capacitor 37 mounted on the PCB 70 caused by moisture infiltrated from an outside may be prevented. Further, when the PCB 70 includes an FR-1 material vulnerable to moisture, a waterproof silk pattern is applied, thereby preventing a decline in insulating properties of the components caused by humidity at low cost.

Figure 8:
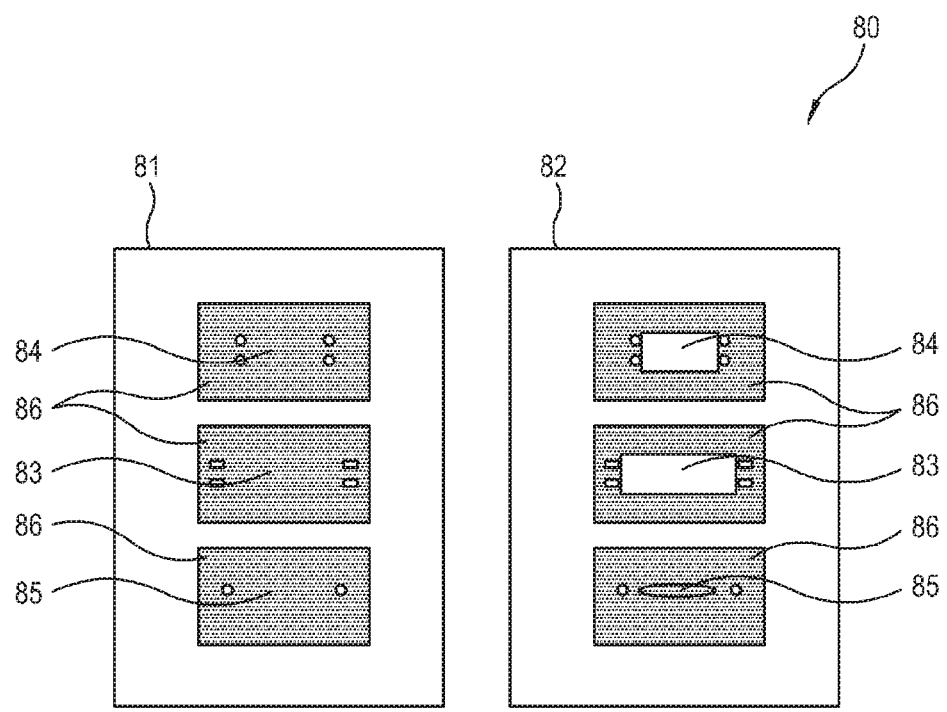
FIG. 8 illustrates an example of applying a waterproof silk pattern to a portion to which a withstanding voltage is applied on a PCB according to an exemplary embodiment.

FIG. 8 illustrates an example of applying a waterproof silk pattern to a portion to which a withstanding voltage is applied on a PCB according to an exemplary embodiment. As illustrated in FIG. 8, the PCB 80 includes a first insulating area 83 formed between the first coil 351 and the second coil 352 of the transformer 35, a second insulating area 84 formed between the light emitter and the light receiver of the photo coupler 36, and a third insulating area 85 where the Y capacitor 37 is disposed. A waterproof coating layer 86 may be formed in an area including the first insulating area 83, the second insulating area 84, and the third insulating area 85. The waterproof coating layer 86 may be formed corresponding to each of the insulating areas on at least one of an upper surface 81 and a lower surface 82. For example, the waterproof coating layer 86 may be formed by applying a waterproof silkscreen ink or silicone dielectric gel having a waterproof function to the PCB 80. Accordingly, a waterproof silk pattern may be applied to areas where the transformer 35, the photo coupler 36, and the Y capacitor 37 are mounted on the PCB 80, thereby preventing a decline in insulating properties caused by moisture infiltrated from an outside.

Figure 9:
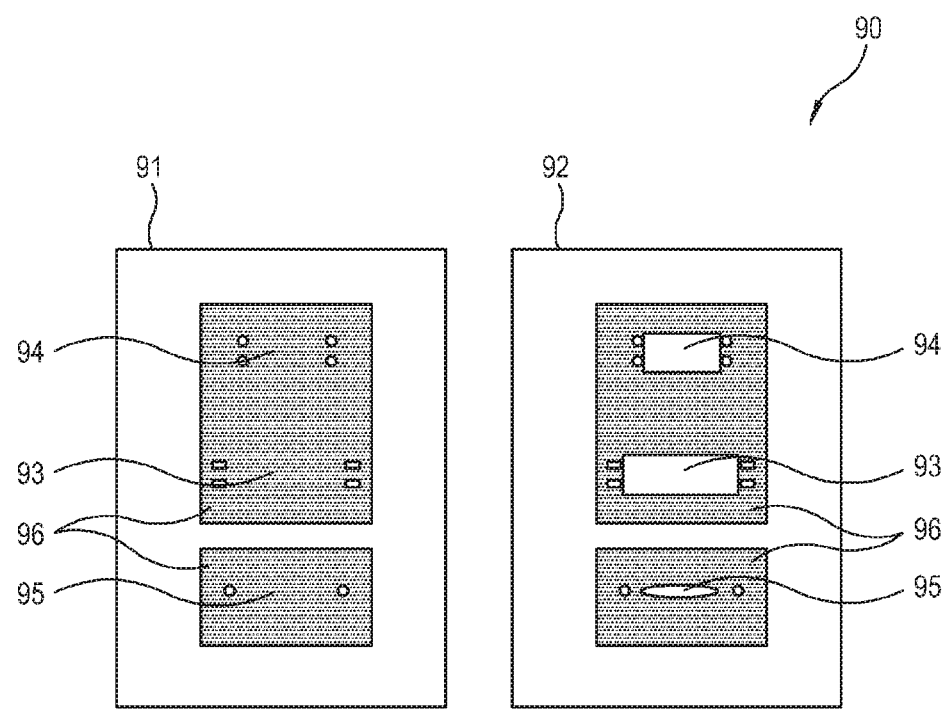
FIG. 9 illustrates an example of applying a waterproof silk pattern to a portion to which a withstanding voltage is applied on a PCB according to an exemplary embodiment.

FIG. 9 illustrates an example of applying a waterproof silk pattern to a portion to which a withstanding voltage is applied on a PCB according to an exemplary embodiment. As illustrated in FIG. 9, the PCB 90 includes a first insulating area 93 formed between the first coil 351 and the second coil 352 of the transformer 35, a second insulating area 94 formed between the light emitter and the light receiver of the photo coupler 36, and a third insulating area 95 where the Y capacitor 37 is disposed. Waterproof coating layers 96 may be formed in an area including the first insulating area 93 and the second insulating area 94 and in the third insulating area 95, respectively, on the PCB 90. For example, the waterproof coating layers 96 may be formed by applying a waterproof silkscreen ink or silicone dielectric gel having a waterproof function to the PCB 90. Further, the waterproof coating layers 96 may be formed on at least one of an upper surface 91 and a lower surface 92 of the PCB 90.

Accordingly, waterproof silk patterns may be applied to the area where the transformer 35 and the photo coupler 36 are mounted and the area where the Y capacitor 37 is mounted, thereby preventing a decline in insulating properties caused by moisture infiltrated from an outside.

Figure 10:
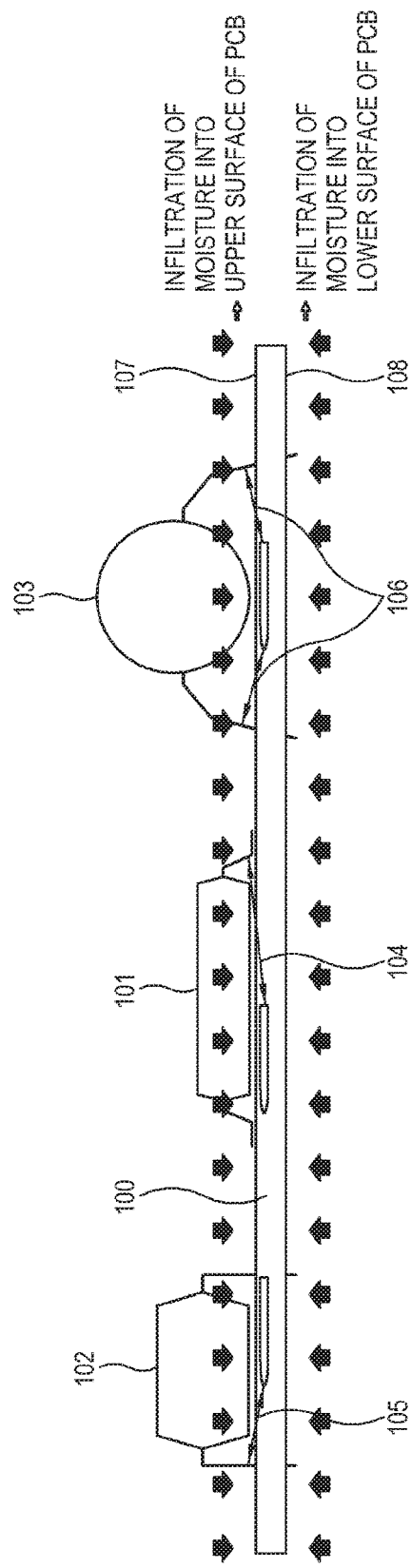
FIG. 10 is a lateral view illustrating a case where moisture infiltrates into a portion on which a component is mounted on a PCB according to an exemplary embodiment.

FIG. 10 is a lateral view illustrating a case where moisture infiltrates into a portion on which a component is mounted on a PCB according to an exemplary embodiment. FIG. 10 shows that moisture infiltrates into an upper surface 107 or lower surface 108 of the PCB 100 in a state where a transformer 101, a photo coupler 102, and a Y capacitor 103 are mounted on the PCB 100 through through-holes. The PCB 100 includes a first insulating area 104, a second insulating area 105, and a third insulating area 106 corresponding to the transformer 101, the photo coupler 102, and the Y capacitor 103, respectively. When moisture infiltrates into the upper surface 107 or lower surface 108 of the PCB 100, insulating areas of the first insulating area 104, the second insulating area 105, and the third insulating area 106 are reduced by the infiltrating moisture. In this case, the transformer 101, the photo coupler 102, and the Y capacitor 103 have reduced insulating properties as compared with when no moisture infiltrates and thus are unable to function properly. Thus, it may be necessary to prevent infiltration of moisture into the upper surface 107 or lower surface 108 of the PCB 100 so that the transformer 101, the photo coupler 102, and the Y capacitor 103 function properly.

FIG. 11 is a lateral view illustrating a case where a waterproof silk pattern is applied to a portion on which a component is mounted on a PCB according to an exemplary embodiment. FIG. 11 shows that a transformer 111, a photo coupler 112, and a Y capacitor 113 are mounted on the PCB 110 through through-holes. The PCB 110 includes a first insulating area 114, a second insulating area 115, and a third insulating area 116 corresponding to the transformer 111, the photo coupler 112, and the Y capacitor 113, respectively. A waterproof coating layers 119 may be formed in an area including the first insulating area 114, the second insulating area 115, and the third insulating area 116 on an upper surface 117 or lower surface 118 of the PCB 110. For example, the waterproof coating layer 119 may be formed by applying a waterproof silkscreen ink or silicone dielectric gel having a waterproof function to the PCB 110. Accordingly, the waterproof coating layer 119 may prevent infiltration of moisture into the upper surface 117 or lower surface 118 of the PCB 110, thereby preventing a decline in insulating properties of the transformer 111, the photo coupler 112, and the Y capacitor 113.

FIG. 12 is a lateral view illustrating a case where a waterproof silk pattern is applied to an AC power input portion on a PCB according to an exemplary embodiment. As illustrated in FIG. 12, in a circuit for power supply, the PCB 120 includes two pairs of live lines 121 and neutral lines 122 to apply AC power in the power input portion and a ground line 123. The ground line 123 may be disposed, for example, to the second coil Co2 of the transformer 41 of FIG. 5. The PCB 120 includes fourth insulating areas 124 and 125 corresponding to at least one of a region between the live line 121 and the ground line 123 and a region between the neutral line 122 and the ground line 123. A waterproof coating layer may be formed in an area including the fourth insulating areas 124 and 125 on upper and lower surfaces of the PCB 120 to prevent infiltration of moisture from an outside. For example, the waterproof coating layer may be formed by applying a waterproof silkscreen ink or silicone dielectric gel having a waterproof function to the PCB 120. Accordingly, a decline in insulating properties of the PCB 120 caused by a decrease in the insulating areas 124 and 125 due to infiltration of moisture into the power input portion may be prevented, and the PCB 120 may be protected from overvoltage caused by lightning.

Figure 13:
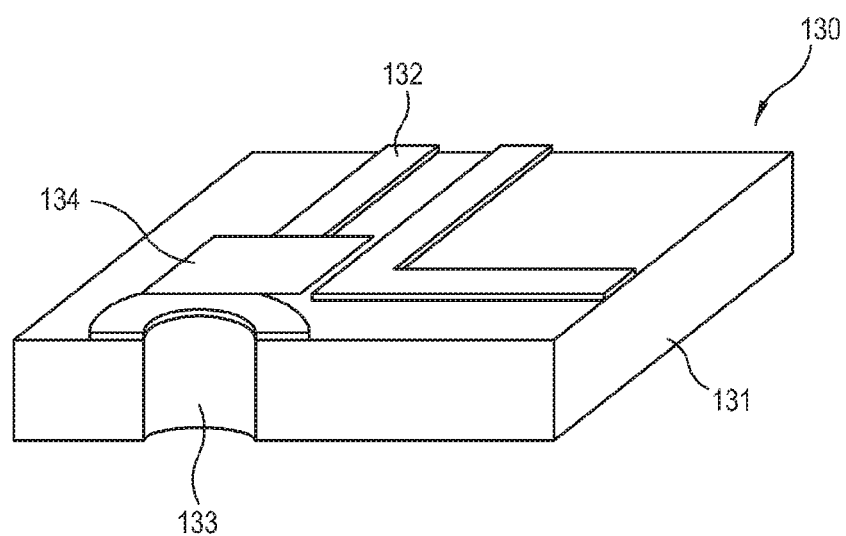
FIG. 13 illustrates an example of forming a waterproof coating layer on a single-sided PCB according to an exemplary embodiment.

FIG. 13 illustrates an example of forming a waterproof coating layer on a single-sided PCB according to an exemplary embodiment. As illustrated in FIG. 13, the single-sided PCB 130 is a PCB having a circuit formed on either side only, which has low density of component mounting and is easy to manufacture. The single-sided PCB 130 may be applied to, for example, a TV, a video tape recorder (VTR), and a stereo system. In the single-sided PCB 130, a single-sided circuit 132 is formed on an upper side and a component is mounted through a through-hole 133. The single-sided PCB 130 may be an FR-1 PCB having an internal portion 131 formed of paper and a phenolic resin. In this case, since the paper and the phenolic resin are vulnerable to moisture, it may be necessary to block moisture from an outside in order that the component mounted on the single-sided PCB 130 normally operates.

According to an exemplary embodiment, in the single-sided PCB 130, the single-sided circuit 132 may be formed on copper foil and a component may be mounted through the through-hole 133. For example, a live line and a neutral line to apply power to the single-sided circuit 132 and a ground line may be formed on the single-sided PCB 130. Here, a waterproof coating layer 134 may be formed in an insulating area between the live line and the ground line on an upper surface of the single-sided PCB 130. The waterproof coating layer 134 may be formed by applying a waterproof silkscreen ink or silicone dielectric gel having a waterproof function to the upper surface of the single-sided PCB 130. Accordingly, a decline in insulating properties of the PCB 130 caused by infiltration of moisture into a power input portion may be prevented, and the PCB 130 may be protected from overvoltage caused by lightning.

Figure 14:
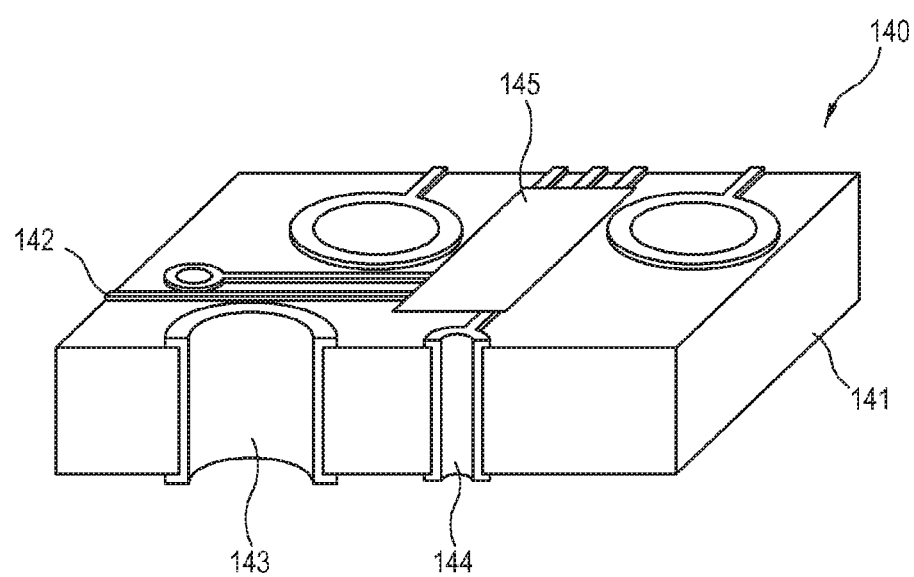
FIG. 14 illustrates an example of forming a waterproof coating layer on a double-sided PCB according to an exemplary embodiment.

FIG. 14 illustrates an example of forming a waterproof coating layer on a double-sided PCB according to an exemplary embodiment. As illustrated in FIG. 14, the double-sided PCB 140 is a PCB having circuits formed on both upper and lower sides and allows high-density component mounting. The double-sided PCB 140 may be applied to low-functioning office automation (OA) devices, such as a printer and a fax, and inexpensive industrial machinery. In the double-sided PCB 140, an upper circuit 142 may be formed on an upper side and a lower circuit may be formed on a lower side. The double-sided PCB 140 may have a through-hole 143 to connect the upper circuit 142 and the lower circuit, thereby mounting a component. Further, the double-sided PCB 140 may have a via hole 144 to connect patterns of the upper circuit 142 and the lower circuit. The double-sided PCB 140 may be an FR-1 PCB having an internal portion 14 formed of paper and a phenolic resin or a PCB formed of glass fabric and an epoxy resin.

According to an exemplary embodiment, in the double-sided PCB 140, the upper circuit 142 and the lower circuit may be formed on copper foil or by copper plating and a component may be mounted through the through-hole 143. For example, the transformer 35, the photo coupler 36, and the Y capacitor 37 among the components of the power supply device 30 of FIG. 3 may be formed on the upper circuit 142 of the double-sided PCB 140. Here, a waterproof coating layer 145 may be formed on upper and lower surfaces of the double-sided PCB 140 in an area including the first insulating area 381, the second insulating area 382, and the third insulating area 383 respectively corresponding to the transformer 35, the photo coupler 36, and the Y capacitor 37. The waterproof coating layer 145 may be formed by applying a waterproof silkscreen ink or silicone dielectric gel having a waterproof function to the upper and lower surfaces of the double-sided PCB 140. Accordingly, a decline in insulating properties of the PCB 140 caused by infiltration of moisture into the insulating areas corresponding to the transformer 35, the photo coupler 36, and the Y capacitor 37 may be prevented.

Figure 15:
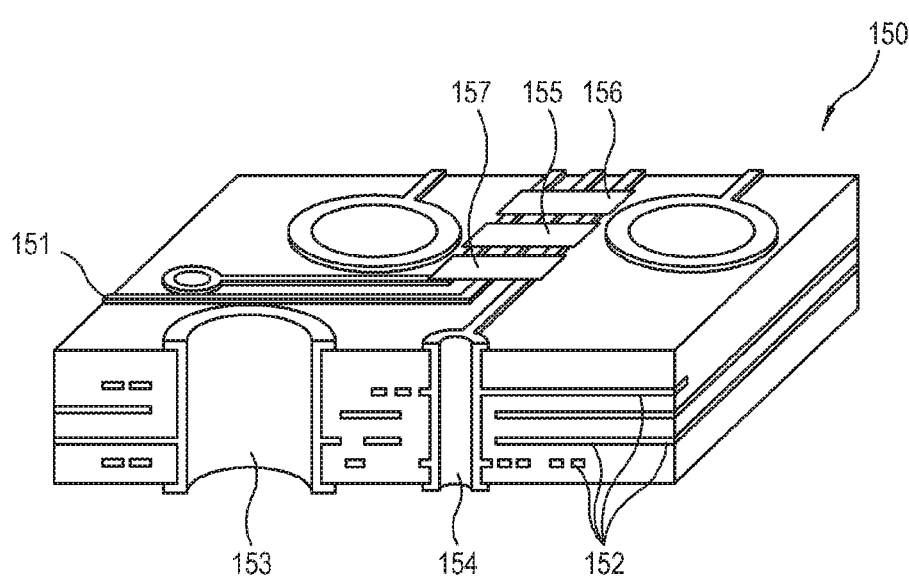
FIG. 15 illustrates an example of forming a waterproof coating layer on a multi-layer PCB according to an exemplary embodiment.

FIG. 15 illustrates an example of forming a waterproof coating layer on a multi-layer PCB according to an exemplary embodiment. As illustrated in FIG. 15, the multi-layer PCB 150 is a stereoscopic PCB having inner-layer and outer-layer circuits and allows high-density component mounting and a shorter wiring distance due to stereoscopic wiring. The multi-layer PCB 150 may be applied to, for example, a large-scale computer, a PC, communication equipment, and small home appliances. In the multi-layer PCB 150, an outer-layer circuit 151 may be formed on an upper side and an inner-layer circuit 152 may be formed on an internal side. The multi-layer PCB 150 may have a through-hole 153 to mount a component and a via hole 154 to connect patterns of the outer-layer circuit 151 and the inner-layer circuit 152.

According to an exemplary embodiment, in the multi-layer PCB 150, the outer-layer circuit 151 and the inner-layer circuit 152 may be formed on copper foil or by copper plating and a component may be mounted through the through-hole 153. For example, the transformer 35, the photo coupler 36, and the Y capacitor 37 among the components of the power supply device 30 of FIG. 3 may be formed on the outer-layer circuit 151 of the multi-layer PCB 150. Here, waterproof coating layers 155, 156, and 157 may be formed on upper and lower surfaces of the multi-layer PCB 150 in the first insulating area 381, the second insulating area 382, and the third insulating area 383 respectively corresponding to the transformer 35, the photo coupler 36, and the Y capacitor 37. The waterproof coating layers 155, 156, and 157 may be formed by applying a waterproof silkscreen ink or silicone dielectric gel having a waterproof function to the upper and lower surfaces of the multi-layer PCB 150. Accordingly, a decline in insulating properties of the multi-layer PCB 150 caused by infiltration of moisture into the insulating areas corresponding to the transformer 35, the photo coupler 36, and the Y capacitor 37 may be prevented.

Figure 16:
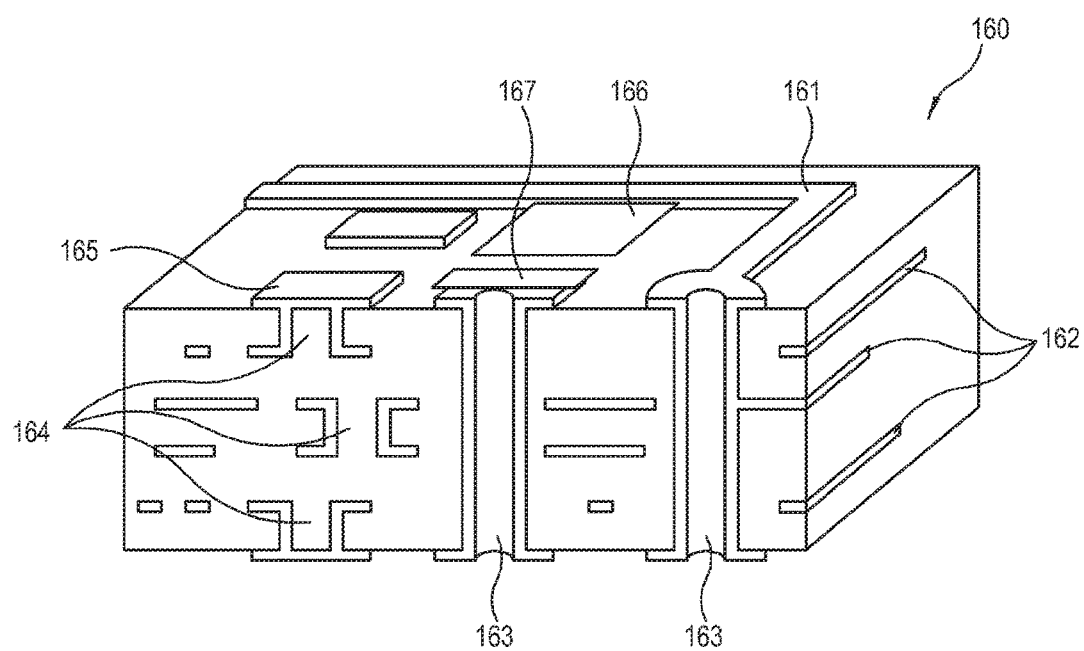
FIG. 16 illustrates an example of forming a waterproof coating layer on an IVH PCB according to an exemplary embodiment.

FIG. 16 illustrates an example of forming a waterproof coating layer on an IVH PCB according to an exemplary embodiment. As illustrated in FIG. 16, the IVH PCB 160 is a stereoscopic PCB having inner-layer and outer-layer circuits, in which an interstitial via hole 164 is formed to enable selective circuit connection in each layer so that a circuit connection hole occupies a minimum area. The IVH PCB 160 may be applied to a high-functioning electronic apparatus, such as a cellular phone, a notebook computer, and a PDA. In the IVH PCB 160, an outer-layer circuit 161 may be formed on an upper side and an inner-layer circuit 162 may be formed on an internal side. The IVH PCB 160 may have a through-hole 163 to mount a component and the interstitial via hole 154 to connect patterns of the outer-layer circuit 161 and the inner-layer circuit 162.

According to an exemplary embodiment, in the IVH PCB 160, the outer-layer circuit 161 and the inner-layer circuit 162 may be formed on copper foil or by copper plating and a component may be mounted through the through-hole 163. For example, the transformer 35, the photo coupler 36, and the Y capacitor 37 among the components of the power supply device 30 of FIG. 3 may be formed on the outer-layer circuit 161 of the IVH PCB 160. Here, waterproof coating layers 166, and 167 may be formed on upper and lower surfaces of the IVH PCB 160 in an area including the first insulating area 381 and the second insulating area 382 corresponding to the transformer 35 and the photo coupler 36 and in the third insulating area 383 corresponding to the Y capacitor 37. The waterproof coating layers 166 and 167 may be formed by applying a waterproof silkscreen ink or silicone dielectric gel having a waterproof function to the upper and lower surfaces of the IVH PCB 160. Accordingly, a decline in insulating properties of the IVH PCB 160 caused by infiltration of moisture into the insulating areas corresponding to the transformer 35, the photo coupler 36, and the Y capacitor 37 may be prevented.

Although exemplary embodiments have been shown and described in detail, it will be appreciated that changes may be made in these exemplary embodiments without departing from the scope the appended claims.

What is claimed is:

1. A power supply device of an electronic apparatus comprising:
   a power receiver configured to receive alternating current (AC) power;
   a rectifier-smoother configured to rectify and smooth the received AC power and output a direct current (DC) power;
   a power converter configured to convert a level of a voltage output from the rectifier-smoother to supply an operating power to the electronic apparatus;
   a circuit board on which the power receiver, the rectifier-smoother, and the power converter are provided; and a waterproof coating layer formed in an area on the circuit board corresponding to a position of the power converter.

2. The power supply device of claim 1, wherein the power converter comprises:
a transformer comprising a first coil configured to receive an input voltage from the rectifier-smoother and a second coil configured to convert the input voltage and provide an output voltage; and
a switching element configured to switch so that a current selectively flows in the first coil of the transformer,
wherein the area in which the waterproof coating layer is formed comprises a first insulating area between the first coil and the second coil.

3. The power supply device of claim 2, wherein the power converter further comprises:
a light emitter of a photo coupler that is connected to the second coil of the transformer and emits light according to a level of the operating power; and
a light receiver of the photo coupler that is connected to the first coil and outputs a feedback signal according to light emission of the light emitter,
wherein the area in which the waterproof coating layer is formed comprises a second insulating area between the light emitter of the photo coupler and the light receiver of the photo coupler.

4. The power supply device of claim 2, wherein the power converter further comprises a capacitor having both ends respectively connected to a first ground connected to the first coil of the transformer and a second ground connected to the second coil of the transformer, and the area in which the waterproof coating layer is formed comprises a third insulating area in which the capacitor is provided.

5. The power supply device of claim 1, wherein the circuit board comprises a plurality of layers, the power converter comprises at least one circuit element provided in one layer among the plurality of layers, and the area in which the waterproof coating layer is formed comprises an area of the layer corresponding to a position of the at least one circuit element.

6. The power supply device of claim 5, wherein the waterproof coating layer is formed on at least one of an upper surface and a lower surface of the layer in which the at least one circuit element is provided.

7. The power supply device of claim 2, wherein the circuit board comprises a pair of lines comprising a first line and a second line to apply the AC power and a ground line connected to the second coil of the transformer, and the area in which the waterproof coating layer is formed comprises a fourth insulating area corresponding to at least one among a region between the first line and the ground line and a region between the second line and the ground line.

8. The power supply device of claim 2, wherein the circuit board comprises a pair of lines comprising a first line and a second line to apply the AC power, a third line diverging from one of the first line and the second line, and a ground line connected to the second coil of the transformer, and the area in which the waterproof coating layer is formed comprises a fifth insulating area between the third line and the ground line.

9. The power supply device of claim 7, wherein the ground line connected to the second coil of the transformer is formed along a periphery of the circuit board and extends to an input line of the power receiver.

10. The power supply device of claim 1, wherein the circuit board comprises an FR-1 material.

11. The power supply device of claim 1, wherein the waterproof coating layer is formed by applying a waterproof silkscreen ink to the area on the circuit board corresponding to the position of the power converter.

12. A display apparatus comprising:
a signal receiver configured to receive an image signal;
a signal processor configured to process the received image signal;
a display configured to display an image based on the processed image signal; and
a power supply configured to receive alternating current (AC) power to supply an operating power to the display, wherein the power supply comprises:
a power receiver configured to receive the AC power;
a rectifier-smoother configured to rectify and smooth the received AC power and output a direct current (DC) power;
a power converter configured to convert a level of a voltage output from the rectifier-smoother to supply operating power to the display apparatus;
a circuit board on which the power receiver, the rectifier-smoother, and the power converter are provided; and
a waterproof coating layer formed in an area on the circuit board corresponding to a position of the power converter.

13. The display apparatus of claim 12, wherein the power converter comprises:
a transformer comprising a first coil configured to receive an input voltage from the rectifier-smoother and a second coil configured to convert the input voltage and provide an output voltage; and
a switching element configured to switch so that a current selectively flows in the first coil of the transformer,
wherein the area in which the waterproof coating layer is formed comprises a first insulating area between the first coil and the second coil.

14. The display apparatus of claim 13, wherein the power converter further comprises:
a light emitter of a photo coupler that is connected to the second coil of the transformer and emits light according to a level of the operating power; and
a light receiver of the photo coupler that is connected to the first coil and outputs a feedback signal according to light emission of the light emitter,
wherein the area in which the waterproof coating layer is formed comprises a second insulating area between the light emitter of the photo coupler and the light receiver of the photo coupler.

15. The display apparatus of claim 13, wherein the power converter further comprises a capacitor having both ends respectively connected to a first ground connected to the first coil of the transformer and a second ground connected to the second coil of the transformer, and the area in which the waterproof coating layer is formed comprises a third insulating area in which the capacitor is provided.

16. The display apparatus of claim 12, wherein the circuit board comprises a plurality of layers, the power converter comprises at least one circuit element provided in one layer among the plurality of layers, and the area in which the waterproof coating layer is formed comprises an area of the layer corresponding to a position of the at least one circuit element.

17. The display apparatus of claim 16, wherein the waterproof coating layer is formed on at least one of an upper surface and a lower surface of the layer in which the at least one circuit element is provided.

18. The display apparatus of claim 13, wherein the circuit board comprises a pair of lines comprising a first line and a second line to apply the AC power and a ground line connected to the second coil of the transformer, and the area in which the waterproof coating layer is formed comprises a fourth insulating area corresponding to at least one among a region between the first line and the ground line and a region between the second line and the ground line.

19. The display apparatus of claim 13, wherein the circuit board comprises a pair of lines comprising a first line and a second line to apply the AC power, a third line diverging from one of the first line and the second line, and a ground line connected to the second coil of the transformer, and the area in which the waterproof coating layer is formed comprises a fifth insulating area between the third line and the ground line.

20. The display apparatus of claim 18, wherein the ground line connected to the second coil of the transformer is formed along a periphery of the circuit board and extends to an input line of the power receiver.

\* \* \* \* \*